(12) United States Patent
Kong et al.

(10) Patent No.: US 12,527,141 B2
(45) Date of Patent: Jan. 13, 2026

(54) DISPLAY LAYER HAVING MONOLITHIC STRUCTURE AND DISPLAY DEVICE INCLUDING THE DISPLAY LAYER

(71) Applicant: SAMSUNG ELECTRONICS CO., LTD., Suwon-si (KR)

(72) Inventors: Kiho Kong, Suwon-si (KR); Junghun Park, Yongin-si (KR); Eunsung Lee, Seoul (KR); Junhee Choi, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 1071 days.

(21) Appl. No.: 17/545,645

(22) Filed: Dec. 8, 2021

(65) Prior Publication Data
US 2023/0005985 A1    Jan. 5, 2023

(30) Foreign Application Priority Data

Jul. 2, 2021  (KR) .................. 10-2021-0087430
Sep. 10, 2021  (KR) .................. 10-2021-0121166

(51) Int. Cl.
*H10H 29/14*    (2025.01)
*H10H 20/857*    (2025.01)

(52) U.S. Cl.
CPC ........ *H10H 29/142* (2025.01); *H10H 20/857* (2025.01)

(58) Field of Classification Search
CPC .............. H10H 29/142; H10H 20/857; G09G 2300/0426; G09G 3/001; G09G 2300/0804; G09G 2300/0857; G09G 2300/0871; G09G 2300/0895; G09G 2380/10; G09G 3/32
See application file for complete search history.

(56) References Cited

U.S. PATENT DOCUMENTS

| | | | |
|---|---|---|---|
| 10,395,594 | B1 | 8/2019 | Charisoulis et al. |
| 10,410,577 | B2 | 9/2019 | Lai et al. |
| 10,886,328 | B1* | 1/2021 | Li ............... H10H 20/825 |
| 2006/0066536 | A1 | 3/2006 | Ota et al. |
| 2015/0069433 | A1 | 3/2015 | Haase |

(Continued)

FOREIGN PATENT DOCUMENTS

| | | |
|---|---|---|
| CN | 111933630 A | 11/2020 |
| JP | 2020-43209 A | 3/2020 |
| KR | 10-2019-0006430 A | 1/2019 |

OTHER PUBLICATIONS

Communication dated Mar. 12, 2025, issued by the Korean Intellectual Property Office in Korean Application No. 10-2021-0121166.

*Primary Examiner* — Victor A Mandala
(74) *Attorney, Agent, or Firm* — Sughrue Mion, PLLC

(57) ABSTRACT

A display device includes a display layer including a plurality of light-emitting devices and a plurality of switching devices in a one-to-one correspondence with the light-emitting devices, the plurality of light-emitting devices and the plurality of switching devices forming a monolithic structure, and a driving layer, wherein the plurality of light-emitting devices and the plurality of switching devices corresponding to the plurality of light-emitting devices are grouped into pixels and then arranged in the display layer, and the driving layer includes a plurality of driving devices configured to apply at least one driving signal to the display layer.

19 Claims, 12 Drawing Sheets

(56) References Cited

U.S. PATENT DOCUMENTS

| | | | |
|---|---|---|---|
| 2017/0025593 A1* | 1/2017 | Bower | H10H 29/142 |
| 2017/0069611 A1* | 3/2017 | Zhang | H01L 25/0753 |
| 2017/0179192 A1* | 6/2017 | Zhang | H01L 25/50 |
| 2018/0233537 A1 | 8/2018 | Liu et al. | |
| 2019/0385944 A1 | 12/2019 | Wang et al. | |
| 2020/0168663 A1* | 5/2020 | Choi | H10H 20/833 |
| 2020/0251049 A1* | 8/2020 | Morris | H01L 25/167 |
| 2020/0312220 A1 | 10/2020 | Hussell et al. | |
| 2021/0082343 A1* | 3/2021 | Lee | H10K 59/131 |
| 2021/0202616 A1* | 7/2021 | Zhang | H10K 59/131 |
| 2021/0375833 A1 | 12/2021 | Lee et al. | |
| 2022/0093577 A1* | 3/2022 | Lin | H01L 25/167 |
| 2022/0093578 A1* | 3/2022 | Lin | H01L 25/162 |
| 2022/0093824 A1* | 3/2022 | Choi | H01L 21/266 |
| 2022/0157884 A1* | 5/2022 | Hartensveld | H10H 20/825 |
| 2022/0190192 A1* | 6/2022 | Park | H10H 20/857 |
| 2022/0190223 A1* | 6/2022 | Hwang | H10H 20/841 |
| 2022/0199674 A1* | 6/2022 | Ahn | H10D 30/675 |
| 2022/0246675 A1* | 8/2022 | Hwang | H10H 29/142 |
| 2022/0415966 A1* | 12/2022 | Kim | H10H 29/142 |
| 2023/0064207 A1* | 3/2023 | Hwang | H01L 25/0753 |
| 2023/0163142 A1* | 5/2023 | Lu | H10D 86/60 |
| | | | 257/91 |

\* cited by examiner

DISPLAY LAYER HAVING MONOLITHIC STRUCTURE AND DISPLAY DEVICE INCLUDING THE DISPLAY LAYER

CROSS-REFERENCE TO RELATED APPLICATIONS

This application is based on and claims priority under 35 U.S.C. § 119 to Korean Patent Application No. 10-2021-0087430 filed on Jul. 2, 2021 and Korean Patent Application No. 10-2021-0121166 filed on Sep. 10, 2021, in the Korean Intellectual Property Office, the disclosures of which are incorporated by reference herein in their entireties.

BACKGROUND

1. Field

The present disclosure relates to a display layer having a monolithic structure and a display device including the display layer.

2. Description of Related Art

A micro light-emitting diode (LED) display module includes a display layer and a complementary metal-oxide-semiconductor (CMOS) backplane. The display layer and the CMOS backplane are respectively manufactured and then integrated into a module through a bonding process. In the bonding process, the display layer and the CMOS backplane are bonded to each other with one pair of bonding pads for each sub-pixel or one pair of bonding pads for each light-emitting device between the display layer and the CMOS backplane. As the pixel density (i.e., the number of pixels per inch, PPI) of the module is increased (or as the pixel pitch is decreased), the gap (hereinafter, the bonding pitch) between the bonding pads decreases. As the gap between the bonding pads decreases, the difficulty of bonding surface processing and an alignment operation increases, and thus, the manufacturing yield decreases.

SUMMARY

Provided are a display layer having a monolithic structure to secure a gap between a plurality of bonding pads and a display device including the display layer.

Additional aspects will be set forth in part in the description which follows and, in part, will be apparent from the description, or may be learned by practice of presented embodiments of the disclosure.

According to an aspect of an example embodiment, a display device includes a display layer including a plurality of light-emitting devices and a plurality of switching devices in a one-to-one correspondence with the plurality of light-emitting devices, wherein the plurality of light-emitting devices and the plurality of switching devices form a monolithic structure; and a driving layer including a plurality of driving devices configured to apply at least one driving signal to the display layer, wherein the display layer includes a plurality of pixels each including at least one light-emitting device of the plurality of light-emitting devices and at least one switching device of the plurality of switching devices.

Each of the plurality of driving devices may correspond to at least one of the plurality of pixels, and each of the plurality of driving devices may be configured to apply a driving signal to the corresponding at least one of the plurality of pixels.

Each of the plurality of driving devices may correspond to at least one of the plurality of pixels, and each of the plurality of driving devices may be electrically connected to the corresponding at least one of the plurality of pixels by a respective pair of bonding pads from among a plurality of pairs of bonding pads between the driving layer and the display layer.

A gap between adjacent pairs of bonding pads of the plurality of pairs of bonding pads may be greater than or substantially equal to a gap between adjacent pixels of the plurality of pixels.

A gap between adjacent pairs of bonding pads of the plurality of pairs of bonding pads may be greater than a gap between adjacent light-emitting device of the plurality of light-emitting devices.

The plurality of pixels may include a first pixel and a second pixel, and a first driving device among the plurality of driving devices may be configured to apply a first driving signal to each of the first pixel and the second pixel.

The plurality of pixels may include a first pixel including a plurality of first light-emitting devices among the plurality of light-emitting devices and a plurality of first switching devices among the plurality of switching devices, the plurality of first switching devices respectively corresponding to the plurality of first light-emitting devices, wherein a first driving device among the plurality of driving devices is configured to apply a first driving signal among the at least one driving signal to the first pixel, and wherein each of the plurality of first light-emitting devices in the first pixel is configured to receive a different portion of the first driving signal via the corresponding first switching device.

The different portions of the first driving signal may be obtained by a time-series division of the first driving signal, and the time-series division may be performed by sequential switching operations via the plurality of switching devices.

The display layer may include a light-emitting layer including the plurality of light-emitting devices; and a switching layer between the light-emitting layer and the driving layer and including the plurality of switching devices, and the light-emitting layer and the switching layer may not have a bonding layer therebetween.

The driving layer may further include a plurality of switch control blocks configured to control the plurality of switching devices to allocate different portions of the at least one driving signal to the plurality of light-emitting devices.

The driving layer may further include a data control block including a plurality of column lines and a scan control block comprising a plurality of row lines, wherein a driving device among the plurality of driving devices corresponds to a pixel among the plurality of pixels and is connected to a column line among the plurality of column lines and a row line among the plurality of row lines, wherein the row line corresponds to a switch control block among the plurality of switch control blocks and to a row of pixels from among the plurality of pixels, wherein some of the plurality of light-emitting devices are connected to the row line, and wherein the plurality of switching devices corresponding to the some of the plurality of light-emitting devices are controlled by the switch control block.

The switch control block may include a plurality of connection lines, wherein a number of bonding pads connecting the switch control block to the display layer is equal to a number of the plurality of light-emitting devices included in the pixel, and wherein the plurality of connection lines extend along the row of pixels connected to the row line and the plurality of connection lines are connected to switching devices from among the plurality of switching devices corresponding to the some of the plurality of light-emitting devices included in the row of pixels connected to the row line.

The row of pixels connected to the row line may include a first pixel and a second pixel, and a connection line of the plurality of connection lines may be connected to both of a first switching device corresponding to a first light-emitting device included in the first pixel and a second switching device corresponding to a second light-emitting device included in the second pixel.

At least one of the plurality of light-emitting devices may have a size of about 0.1 μm to about 200 μm.

According to an aspect of an example embodiment, a display layer includes a plurality of light-emitting devices; a plurality of switching devices, the plurality of switching devices corresponding to the plurality of light-emitting devices in a one-to-one manner; and a plurality of pixels each including at least one light-emitting device of the plurality of light-emitting devices and at least one switching device of the plurality of switching devices, wherein the plurality of light-emitting devices and the plurality of switching devices form a monolithic structure.

The display layer may further include a light-emitting layer including the plurality of light-emitting devices, and a switching layer including the plurality of switching devices, wherein the light-emitting layer and the switching layer have no bonding layer therebetween.

The display layer may further include a plurality of bonding pads, each of the plurality of bonding pads corresponding to a pixel of the plurality of pixels, and the plurality of bonding pads may be arranged on a surface of the display layer.

A gap between adjacent bonding pads of the plurality of bonding pads may be greater than or substantially equal to a gap between adjacent pixels of the plurality of pixels.

A gap between adjacent bonding pads of the plurality of bonding pads may be greater than or substantially equal to a gap between adjacent light-emitting devices of the plurality of light-emitting devices.

At least one of the plurality of light-emitting devices may have a size of about 0.1 μm to about 200 μm.

BRIEF DESCRIPTION OF THE DRAWINGS

The above and other aspects, features, and advantages of certain example embodiments of the disclosure will be more apparent from the following description taken in conjunction with the accompanying drawings, in which.

DETAILED DESCRIPTION

Figure 1A:
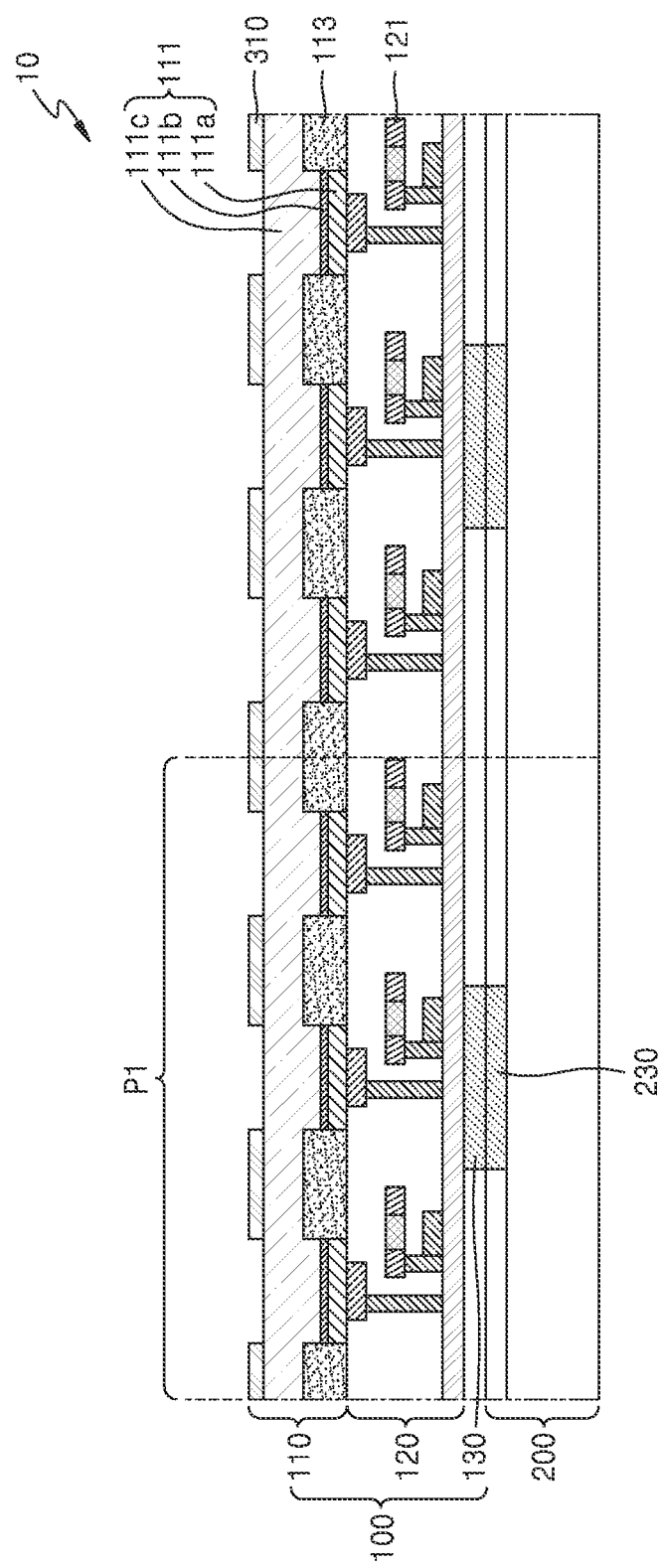
FIG. 1A is a cross-sectional view of a display layer and a display device including the same, according to an example embodiment.

Reference will now be made in detail to embodiments, examples of which are illustrated in the accompanying drawings, wherein like reference numerals refer to like elements throughout. In this regard, embodiments may have different forms and should not be construed as being limited to the descriptions set forth herein. Accordingly, embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments will be described in detail with reference to the accompanying drawings. The embodiments are merely illustrative, and various modifications may be made from these embodiments. In the following drawings, like reference numerals refer to like elements, and sizes of elements in the drawings may be exaggerated for clarity and convenience of description.

Hereinafter, an expression "above" or "on" used herein may include not only "immediately on in a contact manner" but also "on in a non-contact manner". Similarly, an expression "under" or "below" used herein may include not only "immediately below in a contact manner" but also "below in a non-contact manner".

The singular expression also includes the plural meaning as long as it does not inconsistent with the context. In addition, when an element "includes" an element, unless there is a particular description contrary thereto, the element may further include other elements, not excluding the other elements.

The term "the" and other demonstratives similar thereto should be understood to include a singular form and plural forms.

The meaning of "connection" may include not only a physical connection, but also an optical connection, an electrical connection, and the like.

In addition, all example terms (e.g., "such as" or "etc.") are used for the purpose of description and are not intended to limit the scope of the disclosure unless defined by the claims.

Although the terms such as "first" or "1-1" may be used herein to describe various elements, these elements should not be limited by these terms. These terms are only used to distinguish one element from another element.

Figure 1B:
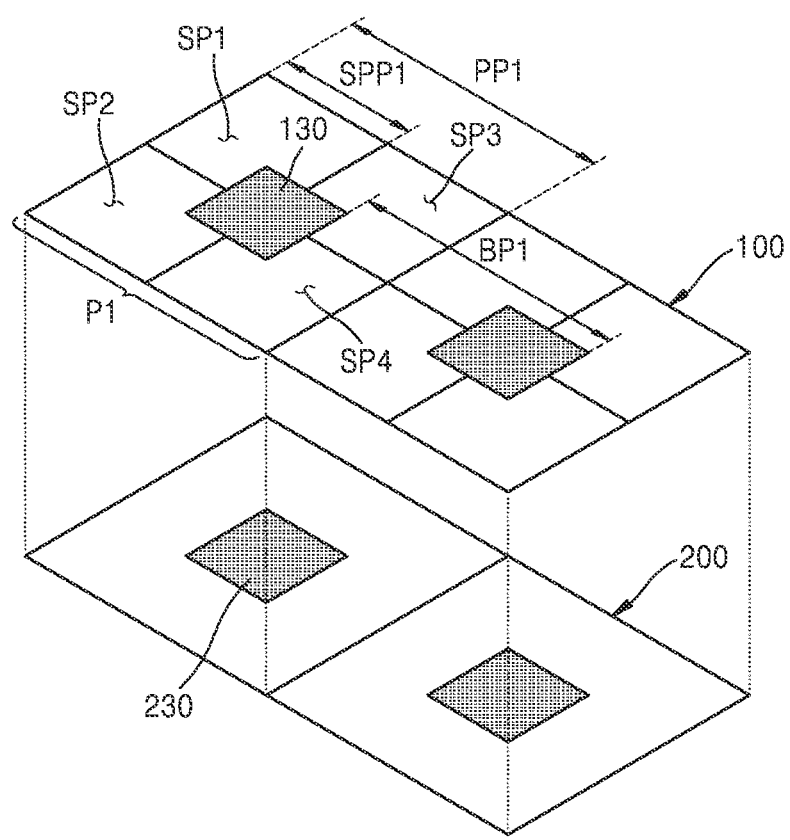
FIG. 1B is a figure demonstrating an arrangement of a display layer, a driving layer corresponding to the display layer, and a pair of bonding pads respectively arranged thereon, according to an example embodiment.

FIG. 1A is a cross-sectional view of a display layer 100 and a display device 10 including the same, according to an example embodiment, and FIG. 1B is a perspective view of the display layer 100, a driving layer 200 corresponding to the display layer 100, and a pair of bonding pads 130 and 230 respectively arranged thereon, according to an example embodiment.

Figure 2A:
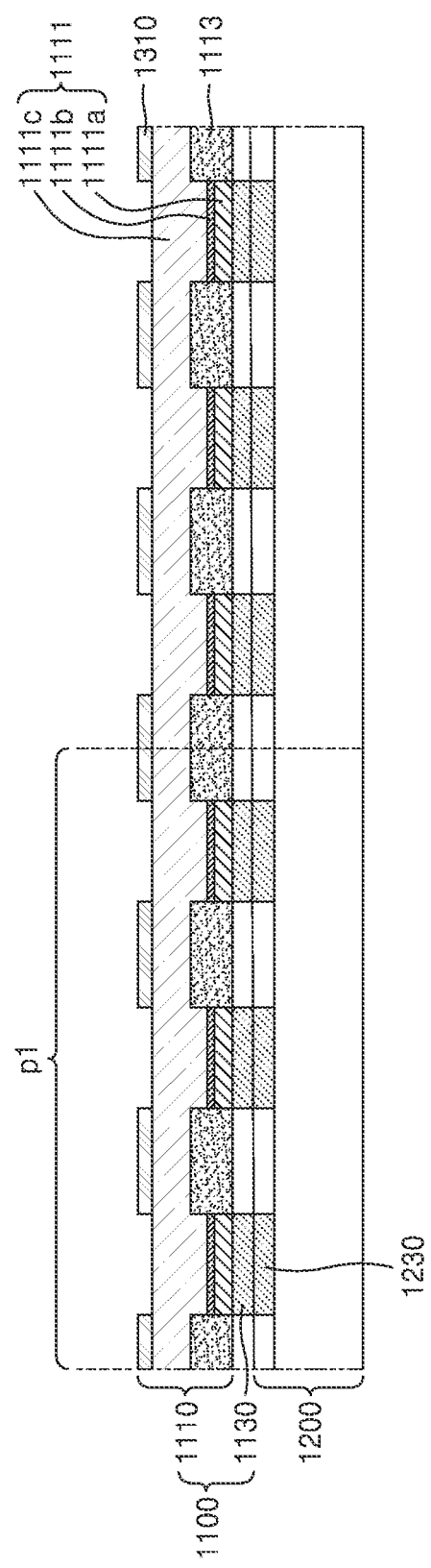
FIG. 2A is a cross-sectional view of a display layer and a display device including the same according to related art.
Figure 2B:
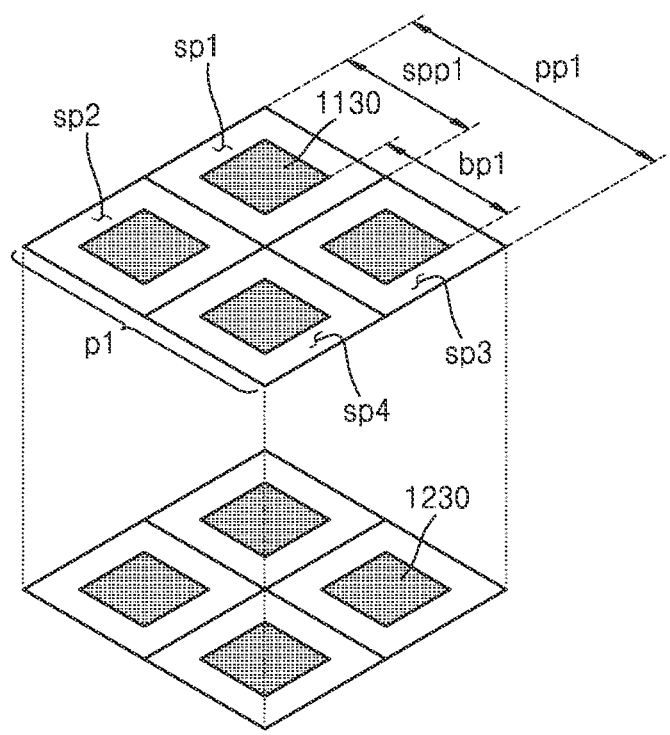
FIG. 2B is a figure demonstrating an arrangement of a display layer, a driving layer corresponding to the display layer, and a pair of bonding pads respectively arranged thereon, according to related art.

FIG. 2A is a cross-sectional view of a display layer 1100 and a display device including the same according to related art, and FIG. 2B is a perspective view of the display layer 1100, a driving layer 1200 corresponding to the display layer 1100, and a pair of bonding pads 1130 and 1230 respectively arranged thereon, according to the related art.

Referring to FIGS. 1A and 1B, in the display layer 100 according to an example embodiment, a plurality of light-emitting devices 111 (hereinafter, also referred to as the first to fourth light-emitting devices) and a plurality of switching devices 121 corresponding to the plurality of light-emitting devices 111 in a one-to-one manner may be grouped into pixels and then arranged, and the plurality of light-emitting devices 111 and the plurality of switching devices 121 may form a monolithic structure. The monolithic structure may mean that a switching layer 120 including the switching devices 121 is single-grown together with a light-emitting layer 110 including the light-emitting devices 111, on one surface of the light-emitting layer 110. The monolithic structure may denote that the light-emitting layer 110 and the switching layer 120 may not have a bonding layer therebetween. Here, the display layer 100 may include a plurality of pixels and each pixel may include at least one light-emitting device and at least one switching device.

The display device 10 according to an example embodiment may include the display layer 100 described above, and the driving layer 200 including a plurality of driving devices 210 (see, e.g., FIG. 3) for applying at least one driving signal to the display layer 100. The at least one driving signal may correspond to the plurality of pixels, or one driving signal may correspond to two or more pixels. The driving layer 200 and the display layer 100 may be bonded and/or connected to each other, and this bonding may be carried out by bonding a plurality of bonding pads 130 on the display layer 100 to a respective corresponding plurality of bonding pads 230 on the driving layer 200. However, the bonding in the display device 10 according to an example embodiment is not limited thereto, and may be performed in various manners.

The display layer 100 according to an example embodiment may include the plurality of pixels. The plurality of pixels may be exclusive without overlapping each other. A first pixel P1 included in the plurality of pixels may include some of the plurality of light-emitting devices 111. In other words, some of the plurality of light-emitting devices 111 may be arranged in the first pixel P1 as shown, e.g., in FIG. 1A. The first pixel P1 may include at least one light-emitting device 111, for example, the first pixel P1 may include three or more light emitting devices 111 to constitute one pixel. The at least one light-emitting device 111 included in the first pixel P1 may constitute one sub-pixel. The same color light may be emitted from a single sub-pixel. That is, when one sub-pixel includes a plurality of light-emitting devices 111, the plurality of light-emitting devices 111 included in the same sub-pixel may emit the same color light, or when a color conversion layer is arranged on the display layer 100, color light emitted from the plurality of light-emitting devices 111 included in the same sub-pixel may pass through the same color conversion layer.

The first to fourth light-emitting devices may be included in the first pixel P1 of the display layer 100 according to an example embodiment. For example, the first light-emitting device may emit red light, the second light-emitting device may emit green light, the third light-emitting device may emit blue light, and the fourth light-emitting device may emit white light. Alternatively, for example, the first light-emitting device may emit red light, the second light-emitting device may emit green light, the third light-emitting device may emit green light having a wavelength different from that of the green light emitted by the second light-emitting device, and the fourth light-emitting device may emit blue light. However, the disclosure is not limited thereto, and the light-emitting devices 111 may respectively emit light of colors different from each other. According to the above example embodiments, the first pixel P1 may constitute one pixel. Although, in the above embodiments, the plurality of light-emitting devices 111 and the plurality of switching devices 121 are grouped into pixels and then arranged, the disclosure is not limited thereto, and the plurality of light-emitting devices 111 and the plurality of switching devices 121 may be otherwise grouped and arranged. For example, the plurality of light-emitting devices 111 and the plurality of switching devices 121, which are grouped (hereinafter, referred to as a first group), may not constitute a single pixel, but instead the first group and a second group adjacent to the first group may together constitute a single pixel.

The display layer 100 according to an example embodiment may include the light-emitting layer 110 including the plurality of light-emitting devices 111. The display layer 100 may include an ion implantation region 113. A semiconductor layer may be doped according to the ion implantation region 113. One light-emitting device 111 among the plurality of light-emitting devices 111 may include a first semiconductor layer 111*a*, an active layer 111*b*, and a second semiconductor layer 111*c*, which may be arranged in this order as shown, e.g., in FIG. 1A. The first semiconductor layer 111*a* and the second semiconductor layer 111*c* may be formed of a group II-VI or group III-V compound semiconductor material. The first semiconductor layer 111*a* and the second semiconductor layer 111*c* serve to provide electrons and holes to the active layer 111*b*. To this end, the first semiconductor layer 111*a* may be doped with an n-type or p-type dopant, and the second semiconductor layer 111*c* may be doped to have a conductivity type electrically opposite to that of the first semiconductor layer 111*a*. For example, the first semiconductor layer 111*a* may be doped with a p-type dopant and the second semiconductor layer 111*c* may be doped with an n-type dopant, or the first semiconductor layer 111*a* may be doped with an n-type dopant and the second semiconductor layer 111*c* may be doped with a p-type dopant. When doping the second semiconductor layer 111*c* with an n-type dopant, for example, silicon (Si) may be used as the dopant, and when doping the first semiconductor layer 111*a* with a p-type dopant, for example, zinc (Zn) may be used as the dopant. Here, the n-type-doped second semiconductor layer 111*c* may provide electrons to the active layer 111*b*, and the p-type-doped first semiconductor layer 111*a* may provide holes to the active layer 111*b*.

The active layer 111*b* has a quantum well structure in which a quantum well is arranged between barriers. As electrons and holes provided from the first semiconductor layer 111*a* and the second semiconductor layer 111*c* recombine with each other in the quantum well structure in the active layer 111*b*, light may be emitted. The wavelength of light generated in the active layer 111*b* may be determined according to a band gap of a material constituting the quantum well in the active layer 111b. The active layer 111b may have a single-quantum well structure, or a multi-quantum well (MQW) structure in which a plurality of quantum wells and a plurality of barriers are alternately arranged. The thickness of the active layer 111b or the number of quantum wells in the active layer 111b may be appropriately selected considering the driving voltage and luminous efficiency of the light-emitting device 111 to be manufactured.

The active layer 111b may include a quantum barrier layer and a quantum well layer. For example, the quantum barrier layer may be formed of gallium nitride (GaN), and the quantum well layer may be formed of indium gallium nitride ($In_xGa_{1-x}N$, $0 \leq x \leq 1$). However, the disclosure is not limited thereto, and the quantum barrier layer or the quantum well layer may be formed of various materials. The active layer 111b may have a structure in which quantum barrier layers and quantum well layers are alternately stacked N times (herein, N is a natural number greater than or equal to 1).

Each of the plurality of light-emitting devices 111 may have a size of about 0.1 µm to about 1000 µm. For example, each of the plurality of light-emitting devices 111 may have a size of about 0.1 µm to about 200 µm. For example, each of the plurality of light-emitting devices 111 may have a size of about 100 µm or less. Here, the size of each of the plurality of light-emitting devices 111 may refer to, for example, the longest length among lengths between two points on the light-emitting device 111. However, the size of the light-emitting device 111 is not limited to the ranges above, and may be greater or less than the ranges.

The display layer 100 according to an example embodiment may include the switching layer 120. The switching layer 120 may be a substrate that is formed or arranged integrally or monolithically with the light-emitting layer 110 in a continuous process performed after the light-emitting layer 110 is processed and manufactured. The switching layer 120 may be integrally or monolithically arranged on the lower surface of the light-emitting layer 110. Here, being integrally or monolithically arranged may denote that any bonding layer is not included between the switching layer 120 and the light-emitting layer 110. Accordingly, it is advantageous in that there is no need to consider an alignment error occurring in the bonding process, etc.

The switching layer 120 may include the plurality of switching devices 121. Each switching device 121 may include a thin-film transistor (TFT), and the TFT may include various types of TFTs, such as low-temperature polycrystalline silicon (LTPS) TFTs, oxide TFTs, or gallium nitride high-electron-mobility transistors (GaN HEMTs). Each of the plurality of switching devices 121 of the switching layer 120 may correspond to one of the plurality of light-emitting devices 111 of the light-emitting layer 110 in a one-to-one manner, and each switching device 121 may be connected to the corresponding light-emitting device 111, so as to switch the corresponding light-emitting device 111 on and off. However, the disclosure is not limited thereto, and each switching device 121 may correspond to one sub-pixel in a one-to-one manner, and the one sub-pixel may include two or more light-emitting devices 111.

The first pixel P1 of the display layer 100 may include at least one light-emitting device 111, and the switching device 121 corresponding thereto may be arranged in the switching layer 120. For example, the first light-emitting device included in the first pixel P1 may be driven through a first switching device corresponding to the first light-emitting device, and the second light-emitting device included in the first pixel P1 may be driven through a second switching device corresponding to the second light-emitting device. One switching device 121 may be connected to correspond to one light-emitting device 111. When a first driving signal corresponding to the first pixel P1 is applied to the first pixel P1, a signal for driving the first light-emitting device, in the first driving signal, is applied to the first light-emitting device through the first switching device, and thus the first light-emitting device may be driven. In addition, a signal for driving the second light-emitting device, in the first driving signal, may be applied to the second light-emitting device through the second switching device, and thus the second light-emitting device may be driven. A switch control block 250 (see, e.g., FIG. 3) may control the plurality of switching devices 121 to allocate each signal for driving each light-emitting device 111, in a driving signal, to each light-emitting device 111. The switch control block 250 may be included in the driving layer 200 which will be described below, and each switching device 121 may be controlled by the switch control block 250, and different portions of the driving signal may be respectively allocated to the light-emitting devices 111 each corresponding to each switching device 121. The switch control block 250 will be described below.

The display layer 100 of the display device 10 according to an example embodiment may further include an electrode 310. The electrode 310 may be referred to as an n-type electrode when the second semiconductor layer 111c is of n-type, and may be referred to as a p-type electrode when the second semiconductor layer 111c is of p-type. Another electrode corresponding to the electrode 310 may be a connection node between the light-emitting device 111 and the switching device 121.

The display layer 100 according to an example embodiment may further include the plurality of bonding pads 130. The plurality of bonding pads 130 may be arranged on one surface of the display layer 100, and for example, may be arranged on the lower surface of the switching layer 120. At least one bonding pad 130 may be arranged in each pixel, and for example, one bonding pad 130 is arranged in each pixel. However, the disclosure is not limited thereto, and in the case where a single driving device 210 applies a driving signal to two or more pixels, one bonding pad 130 may be arranged for two or more pixels. For example, a first bonding pad among the plurality of bonding pads 130 may be arranged in the first pixel P1 of the display layer 100. The plurality of bonding pads 130 may serve to bond the display layer 100 to the driving layer 200. By bonding the display layer 100 to the driving layer 200, the display device 10 may be formed. The driving layer 200 may also include the plurality of bonding pads 230 corresponding to the plurality of bonding pads 130 of the display layer 100. The plurality of bonding pads 130 of the display layer 100 may correspond to the plurality of bonding pads 230 of the driving layer 200 in a one-to-one manner, and a bonding pad 130 along with the corresponding bonding pad 230 may collectively be referred to as a pair of bonding pads 130 and 230. When the pair of bonding pads 130 and 230 are bonded to each other, they may be referred to as a bonding area BA0. The plurality of bonding pads 230 of the driving layer 200 may be formed of substantially the same material as that of the plurality of bonding pads 130 of the display layer 100, and, even in the case where the plurality of bonding pads 230 of the driving layer 200 are formed of a material different from that of the plurality of bonding pads 130 of the display layer 100, the plurality of bonding pads 230 of the driving layer 200 may perform substantially the same function as that of the plurality of bonding pads 130 of the display layer 100, in that they both perform a function of bonding. When the pair of bonding pads 130 and 230 are bonded to each other (i.e., when the bonding area BA0 is formed), the display layer 100 and the driving layer 200 may be bonded to each other. The bonding of the display layer 100 and the driving layer 200 may be performed in various manners. For example, the display layer 100 and the driving layer 200 may be bonded to each other through copper-to-copper (C2C) bonding, etc.

When the display layer 100 and the driving layer 200 are bonded to each other, a region of the driving layer 200 corresponding to the first pixel P1 of the display layer 100 may be referred to as a first region. The first bonding pad 130 may be arranged on the first pixel P1 of the display layer 100, and a bonding pad 230 corresponding to the first bonding pad may be arranged in the first region of the driving layer 200. Only the first bonding pad may be arranged in the first pixel P1, and only the bonding pad (hereinafter, referred to as the first corresponding bonding pad) corresponding to the first bonding pad may be arranged in the first region. The first bonding pad and the first corresponding bonding pad are bonded to each other (hereinafter, referred to as a first bonding area) and may be electrically connected to each other. The plurality of light-emitting devices 111 or a plurality of sub-pixels SP1, SP2, SP3, and SP4 (hereinafter, also referred to as the first to fourth sub-pixels SP1, SP2, SP3, and SP4) included in the first pixel P1 may receive a driving signal from the driving layer 200 through the first bonding area. Referring to FIGS. 2A and 2B, in related art, in order for one light-emitting device 1111 or one of sub-pixels sp1, sp2, sp3, and sp4 (hereinafter, also referred to as the first to fourth sub-pixels sp1, sp2, sp3, and sp4) to receive a driving signal from the driving layer 1200, one pair of bonding pads 1130 and 1230 is required for each light-emitting device 1111 or each of the sub-pixels sp1, sp2, sp3, and sp4, respectively. Accordingly, as the PPI increases (or as the pixel pitch decreases), the gap between the bonding pads 1130 (hereinafter, referred to as a bonding pitch bp1) decreases. As the bonding pitch bp1 decreases, the difficulty of a bonding surface processing and alignment operation increases, and thus the manufacturing yield decreases. In the display device 10 including the display layer 100 and the driving layer 200 according to an example embodiment, the plurality of light-emitting devices 111 or the plurality of sub-pixels may receive a driving signal through one bonding area BA0, thus the bonding pitch BP1 which is wider than the bonding pitch bp1 of the related art may be achieved, and accordingly, a decrease in manufacturing yield may be alleviated or prevented. The bonding pitch BP1, which is the gap between the bonding pads 130, may be referred to as the gap between a bonding area BA0 and another bonding area BA0 adjacent to the bonding area BA0.

Referring to FIG. 1B, the first pixel P1 of the display layer 100 according to an example embodiment may include the first to fourth light-emitting devices. The first light-emitting device may constitute the first sub-pixel SP1, the second light-emitting device may constitute the second sub-pixel SP2, the third light-emitting device may constitute the third sub-pixel SP3, and the fourth light-emitting device may constitute the fourth sub-pixel SP4. The first pixel P1 may constitute one pixel. The bonding pitch BP1 between one bonding pad 130 arranged in the first pixel P1 and one bonding pad 130 arranged in an adjacent pixel may be substantially equal to a pixel pitch PP1. The bonding pitch BP1 may be approximately twice a sub-pixel pitch SPP1. In other words, when the first pixel P1 is connected to the driving layer 200 by the first bonding area, the bonding pitch BP1 may be greater than at least the gap between the light-emitting devices 111 or the sub-pixel pitch SPP1. In addition, because one bonding pad 130 is arranged in each pixel, the bonding pitch BP1 may be substantially equal to or greater than the pixel pitch PP1. The bonding pitch BP1 of the display layer 100 may be constant for each pixel.

Referring to FIG. 2B, a first pixel p1 of the display layer 1100 according to the prior art may include first to fourth light-emitting devices. The first light-emitting device may constitute the first sub-pixel sp1, the second light-emitting device may constitute the second sub-pixel sp2, the third light-emitting device may constitute the third sub-pixel sp3, and the fourth light-emitting device may constitute the fourth sub-pixel sp4. The first pixel p1 may constitute one pixel. A first bonding pad 1130 may be positioned in the first sub-pixel sp1, a second bonding pad 1130 may be positioned in the second sub-pixel sp2, a third bonding pad 1130 may be positioned in the third sub-pixel sp3, and a fourth bonding pad 1130 may be positioned in the fourth sub-pixel sp4. The bonding pitch bp1 between the first bonding pad and the second bonding pad may be half of a pixel pitch pp1. The bonding pitch bp1 may be equal to the length of a sub-pixel pitch spp1. The bonding pitch BP1 of the display layer 100 according to an example embodiment may be greater than the bonding pitch bp1 of the display layer according to the prior art.

The bonding pitch between bonding areas BA1 connected to the switch control block 250, which will be described below, may be greater than the bonding pitch BP1 between two adjacent bonding areas BA0 of the display layer 100 including the light-emitting devices 111.

The display device 10 according to an example embodiment may include the display layer 100 and the driving layer 200 according to the example embodiments described above. The driving layer 200 may include a plurality of regions, and each region may correspond to each pixel of the display layer 100 as described above. The region of the driving layer 200 corresponding to the first pixel P1 of the display layer 100 may be referred to as the first region. The first bonding pad (e.g., bonding pad 130) may be arranged in the first pixel P1 of the display layer 100, and the first corresponding bonding pad (e.g., bonding pad 230) corresponding to the first bonding pad may be arranged in the first region of the driving layer 200.

Figure 3:
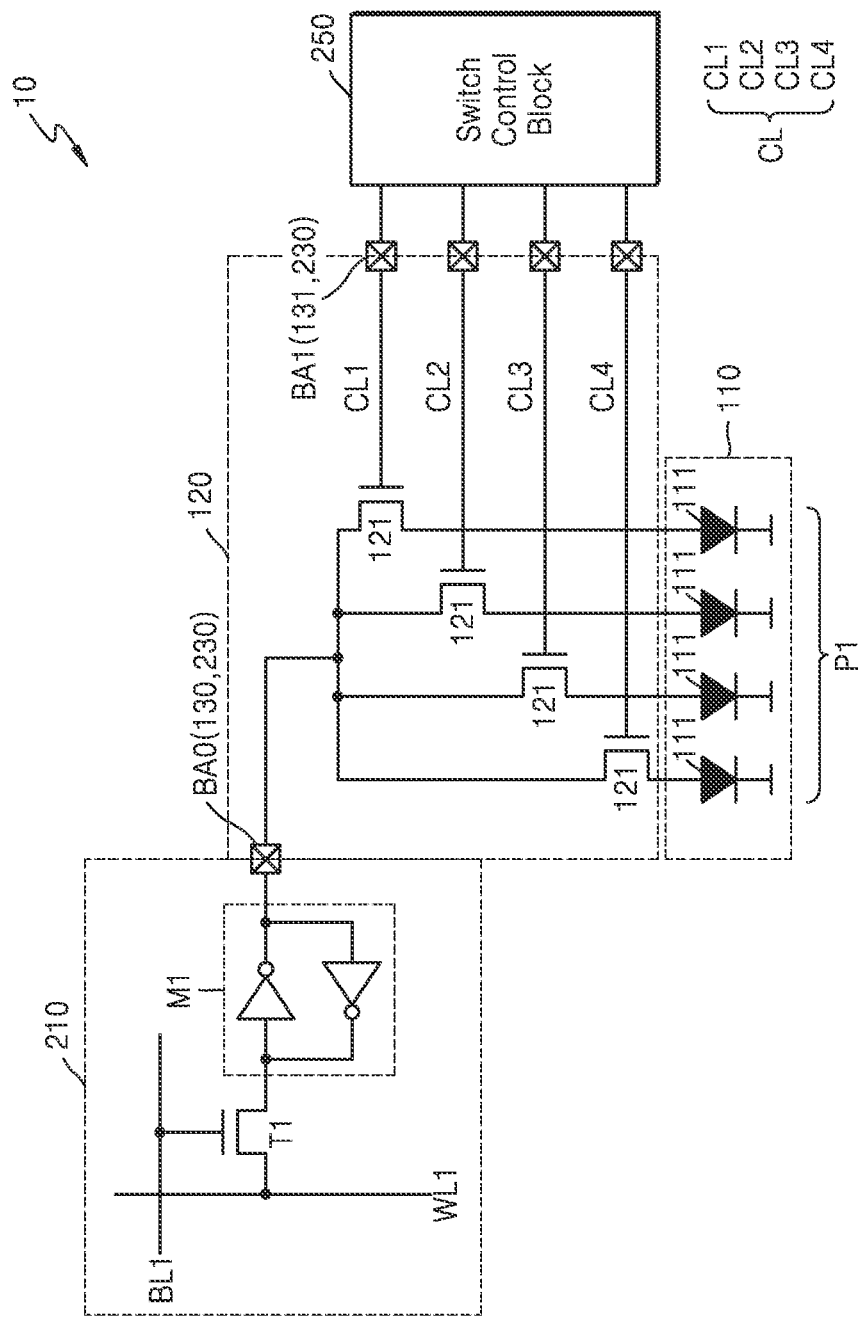
FIG. 3 is a conceptual diagram of a first pixel and a first region of a display device according to an example embodiment.
Figure 4:
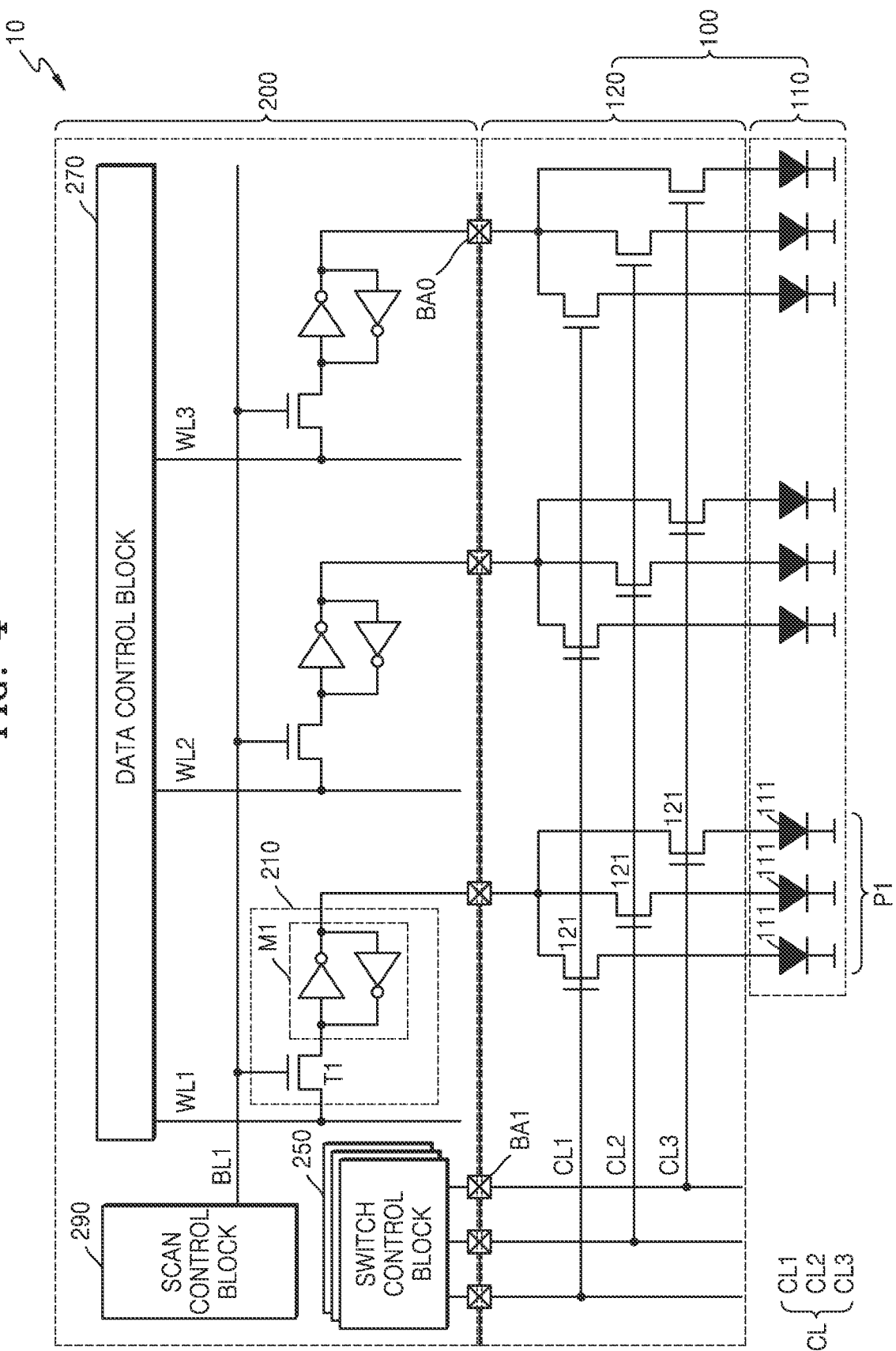
FIG. 4 is a conceptual diagram of a display device according to an embodiment.

FIG. 3 is a conceptual diagram of the first pixel P1 and the first region of the display device 10 according to an example embodiment, and FIG. 4 is a conceptual diagram of the display device 10 according to an example embodiment.

Referring to FIG. 3, each region of the display device 10 according to an example embodiment may include a driving device 210, and the driving device 210 may apply at least one driving signal. One driving device 210 may be allocated and arranged in each region of the driving layer 200. For example, the first driving device arranged in the first region of the driving layer 200 may apply a driving signal to the plurality of light-emitting devices 111 included in the first pixel P1 of the display layer 100 connected to the first region of the driving layer 200 through the first bonding area. That is, when one driving device 210 may apply a driving signal to the plurality of light-emitting devices 111, and the plurality of light-emitting devices 111 constitute one pixel, the driving signal may be applied to one pixel by using one driving device 210. One driving device 210 of the driving layer 200 may be electrically connected to the plurality of light-emitting devices 111 or the plurality of sub-pixels of one pixel of the display layer 100 through the bonding areas BA0. That is, the display device 10 may be configured such that one driving device 210 corresponds to N light-emitting devices 111 or M sub-pixels (here, N and M are integers greater than or equal to 1, and N is greater than or equal to M).

One driving device 210 of one region may include a transistor T1, a memory M1, and the like. For example, the memory M1 may be SRAM (static random-access memory), but is not limited thereto, and may be any type of memory.

The display device according to related art with reference to FIG. 2A includes a plurality of driving devices to constitute one pixel. For example, the driving layer 1200 includes three or more driving devices corresponding to one pixel, and the three driving devices respectively drive three light-emitting devices 1111 through three different pairs of bonding pads (i.e., three different bonding areas) 1130 and 1230 to implement one pixel. In such an existing configuration, as the PPI increases, the bonding pitch bp1 between the bonding pads 1130 becomes relatively narrow, and thus the manufacturing yield may decrease. In addition, because a plurality of driving devices are required to be arranged to constitute one pixel, manufacturing costs and time increase, and it may be necessary to further secure a space between the driving devices arranged in the driving layer 1200.

On the other hand, in the display device 10 according to an example embodiment, one driving device 210 may drive the plurality of light-emitting devices 111 through one bonding area BA0 so as to implement one pixel, and accordingly, when manufacturing a display, the manufacturing yield may be relatively greater than that in the related art. Driving the plurality of light-emitting devices 111 by using one driving device 210 may mean that the plurality of light-emitting devices 111 share one driving device 210. By the sharing of the driving device 210, it is possible to secure a space between the driving devices 210 arranged on the driving layer 200, and the driving power and manufacturing costs and time of the display device 10 may also be reduced. In particular, the display device 10 according to an example embodiment is useful for an augmented reality (AR) and/or virtual reality (VR) display having a glasses-type or head-mounted structure, which requires high PPI, or a device including the same. However, the disclosure is not limited thereto, and the display device 10 may be used in a lens-type device or the like and may be used in a general micro-LED display or the like.

Referring to FIG. 3, the display device 10 according to an example embodiment may further include one or a plurality of switch control blocks 250 in the driving layer 200. The one or more switch control blocks 250 may control the switching devices 121 to allocate portions of a driving signal being transmitted from the driving device 210 to the plurality of light-emitting devices 111, to the respective light-emitting devices 111. Here, each of the switching devices 121 may correspond to a respective light-emitting device 111. That is, the driving signal may be a combination of signals each corresponding to a respective light-emitting device 111, and the one or more switch control blocks 250 may allocate the signals each corresponding to the respective light-emitting device 111 in the combined driving signal, to the respective light-emitting devices 111, by controlling the switching devices 121 each corresponding to the respective light-emitting device 111. The one or more switch control blocks 250 may include one or more connection lines CL for connection with the plurality of switching devices 121 included in the switching layer 120. Each of the connection lines CL may extend from the switch control block 250 to the switching device 121 arranged in the switching layer 120. The one or more switch control blocks 250 may be connected to the plurality of switching devices 121 through the connection lines CL, and each switching device 121 may be controlled through the one or more switch control blocks 250 to operate the corresponding light-emitting device 111.

The one or more switch control blocks 250 may be included and/or arranged in the driving layer 200, and the one or more switch control blocks 250 may be connected to the plurality of switching devices 121 included in the switching layer 120. Bonding areas BA1 may be arranged between the driving layer 200 and the display layer 100 to connect the one or more switch control blocks 250 to the plurality of switching devices 121. When the pair of bonding pads 131 and 230 are bonded to each other, they may be referred to as a bonding area BA1. In other words, each of the one or more switch control blocks 250 may be connected to the display layer 100 by at least one pair of bonding pads 131 and 230. Here, the pair of bonding pads 131 and 230 may consist of a bonding pad 131 of the display layer 100, and a corresponding bonding pad 230 of the driving layer 200 corresponding to the bonding pad 131 of the display layer 100. The bonding pad 131 of the pair of bonding pads 131 and 230 may be for connecting the switch control block 250 to the display layer 100, and may be distinguished from the bonding pad 130 for connecting the driving device 210 to the display layer 100. That is, in addition to the bonding areas BA0 arranged in the pixel, the bonding areas BA1 for connecting the switch control block 250 to the display layer 100 may be formed and arranged. In the case where the plurality of light-emitting devices 111 or the plurality of sub-pixels are included in the first pixel P1 of the display layer 100, boding areas BA1 for connecting one switch control block 250 to the display layer 100 may be arranged such that the number of the bonding areas BA1 is equal to the number of the plurality of light-emitting devices 111 or the plurality of sub-pixels. For example, in the case where the first pixel P1 of the display layer 100 includes four light-emitting devices 111 each constituting one sub-pixel, four switching devices 121 may be arranged in the switching layer 120 in order to switch the four light-emitting devices 111 on and off. For connection between one switch control block 250 and the four switching devices 121, four bonding areas BA1 for connection between one switch control block 250 and the display layer 100 may be arranged. The connection lines CL may be respectively arranged in the bonding areas BA1, and the connection lines CL may be spaced apart from each other. For example, in the case where the driving signal applied from one driving device 210 is a combination of driving signals for the first to fourth light-emitting devices, the driving signal corresponding to the first light-emitting device may be allocated to the first light-emitting device through the first switching device which is controlled by a first switch control block. In addition, the driving signal corresponding to the second light-emitting device may be allocated to the second light-emitting device through the second switching device which is controlled by a second switch control block. The driving signals for the third light-emitting device and the fourth light-emitting device may be allocated in the same manner. As in the previous example embodiment, in order to connect one switch control block 250 to the four switching devices 121, four bonding pads 131 may be arranged on the display layer 100, and four corresponding bonding pads 230 may be arranged on the driving layer 200. Although it is described that one switch control block 250 corresponds to one pixel or one driving device 210 in the previous example, one switch control block 250 may not necessarily correspond to only one driving device 210 and may correspond to the plurality of driving devices 210.

The gap between the plurality of bonding areas BA1 arranged to connect the one or more switch control blocks 250 to the display layer 100, i.e., the bonding pitch, may be, for example, greater than or equal to the pixel pitch. One switch control block 250 may be arranged to correspond to the plurality of driving devices 210 connected to the one switch control block 250. The one or more switch control blocks 250 may be arranged at one end of the cross-section of the display device 10 according to an example embodiment, across a region larger than one pixel. Because they may be arranged across the region larger than one pixel, the bonding pitch of the bonding areas BA1 may be greater than the bonding pitch of the bonding areas BA0 arranged in the pixel.

Referring to FIG. 4, the driving layer 200 of the display device 10 according to an example embodiment may include a data control block 270 including a plurality of column lines and a scan control block 290 including a plurality of row lines. One or more driving devices 210 may be arranged in the vicinity of each of a plurality of intersections where the plurality of column lines and the plurality of row lines intersect each other. A region in which the one or more driving devices 210 are arranged at one of the intersections of the driving layer 200 may be a region of the driving layer 200. For example, a region in which the first driving device, which is arranged in the vicinity of the intersection of the first column line WL1 and the first row line BL1 and is connected to the first column line WL1 and the first row line BL1, is arranged may be the first region. For example, in the case where the number of row lines is N (N is an integer greater than or equal to 1) and the number of column lines is M (M is an integer greater than or equal to 1), the driving layer 200 may include (M×N) regions, and may include (M×N) driving devices 210. Here, the term "intersection" does not mean that the column lines and the row lines directly contact each other, but may be referred to as a point at which the driving device 210 and the like are connected to one column line and one row line intersecting each other, so as to receive data from the one column line and operate or control devices connected to the driving device 210.

In the display device 10 according to an example embodiment, the plurality of light-emitting devices 111 included in a plurality of pixels connected to one row line may be allocated respective corresponding driving signals by the same switch control block 250. For example, the plurality of light-emitting devices 111 included in the plurality of pixels connected to the first row line BL1 may be allocated respective corresponding driving signals by the first switch control block. Assuming that first to M-th pixels receive respective corresponding driving signals from the first row line BL1, a first switching device of the first pixel (hereinafter, referred to as the 1-1 switching device), a first switching device of the second pixel (hereinafter, referred to as the 2-1 switching device), . . . , an M-1 switching device may be connected to the first switch control block through a first connection line CL1 of the first switch control block. The first connection line CL1 may extend along the first to M-th pixels connected to the first row line BL1. In this case, a first light-emitting device of the first pixel (hereinafter, referred to as the 1-1 light-emitting device) may be operated through the 1-1 switching device, and a first light-emitting device of the second pixel (hereinafter, referred to as the 2-1 light-emitting device) may be operated through the 2-1 switching device. Similarly, a second switching device of the first pixel (hereinafter, the 1-2 switching device), a second switching device of the second pixel (hereinafter, the 2-2 switching device), . . . , an M-2 switching device may be connected to the first switch control block through a second connection line CL2 of the first switch control block. The number of row lines and the number of switch control blocks 250 of the display device 10 according to an example embodiment may be equal to each other. However, the disclosure is not limited thereto, and the number of row lines may be greater or less than the number of the switch control blocks 250.

The driving signals corresponding to the respective light-emitting devices 111 may be divided from the driving signal applied from one driving device 210 in a time-series manner. For example, assuming that the first pixel receives a first driving signal from the first driving device, the 1-1 light-emitting device may receive only a signal corresponding to the 1-1 light-emitting device in the first driving signal when the 1-1 switching device is switched on by the first switch control block. Similarly, a 1-2 light-emitting device may receive only a signal corresponding to the 1-2 light-emitting device in the first driving signal when the 1-2 switching device is switched on by the first switch control block. The plurality of switching devices 121 may be switched on in a time-series manner, and the driving signal applied from the driving device 210 may be divided into different portions of the driving signal in a time-series manner and then applied to the respective light-emitting devices 111. That is, the driving signals corresponding to the respective light-emitting devices 111 may be sequentially applied to the respective light-emitting devices 111 according to the order in which the plurality of switching devices 121 are switched on.

M pixels (M is an integer greater than or equal to 1) connected to the first row line BL1 may have M bonding areas BA0 with M driving devices 210 as shown, e.g., in FIG. 4. Also, in the case where four light-emitting devices 111 constitute one pixel, four bonding areas BA1 are provided for connecting the first switch control block to the display layer 100. That is, the display device 10 may include a total of (M+4) bonding areas, i.e., the M bonding areas BA0 and the four bonding areas BA1, for each of the row lines. However, the disclosure is not limited thereto, and in the case where the number of light-emitting devices 111 connected to each driving device 210 is not four but $n_{sp}$ ($n_{sp}$ is an integer greater than or equal to 1), the display device 10 may include a total of (M+$n_{sp}$) bonding areas, i.e., the M bonding areas BA0 and $n_{sp}$ bonding areas BA1, for each of the row lines. In the case where the number of row lines of the display device 10 is N (N is an integer greater than or equal to 1), the display device 10 includes a total of (M+$n_{sp}$)*N bonding areas, i.e., (M*N) bonding areas BA0 and ($n_{sp}$*N) bonding areas BA1. In the display device according to related art with reference to FIG. 2A and FIG. 2B, for example, in the case where $n_{pr}$ driving devices ($n_{pr}$ is an integer greater than or equal to 1) are arranged in one region, $n_{pr}$ light-emitting devices 1111 corresponding to the $n_{pr}$ driving devices are arranged in the display layer 1100, and the number of pixels connected to a first row line is M, the display device includes ($n_{pr}$*M) bonding areas for each row line. When N row lines are provided, the display device according to the related art includes ($n_{pr}$*M*N) bonding areas. This number may be greater than the sum of the number of bonding areas BA0 and the number of bonding areas BA1 of the display device 10 according to an example embodiment. That is, because the bonding pitch BP1 of the display device 10 according to the example embodiment is greater than the bonding pitch bp1 of the display device of the prior art, the manufacturing yield of the display device 10 may be greater than that of the display device of the prior art, when the sizes of the two display devices and the numbers of pixels are respectively equal to each other.

Figure 5:
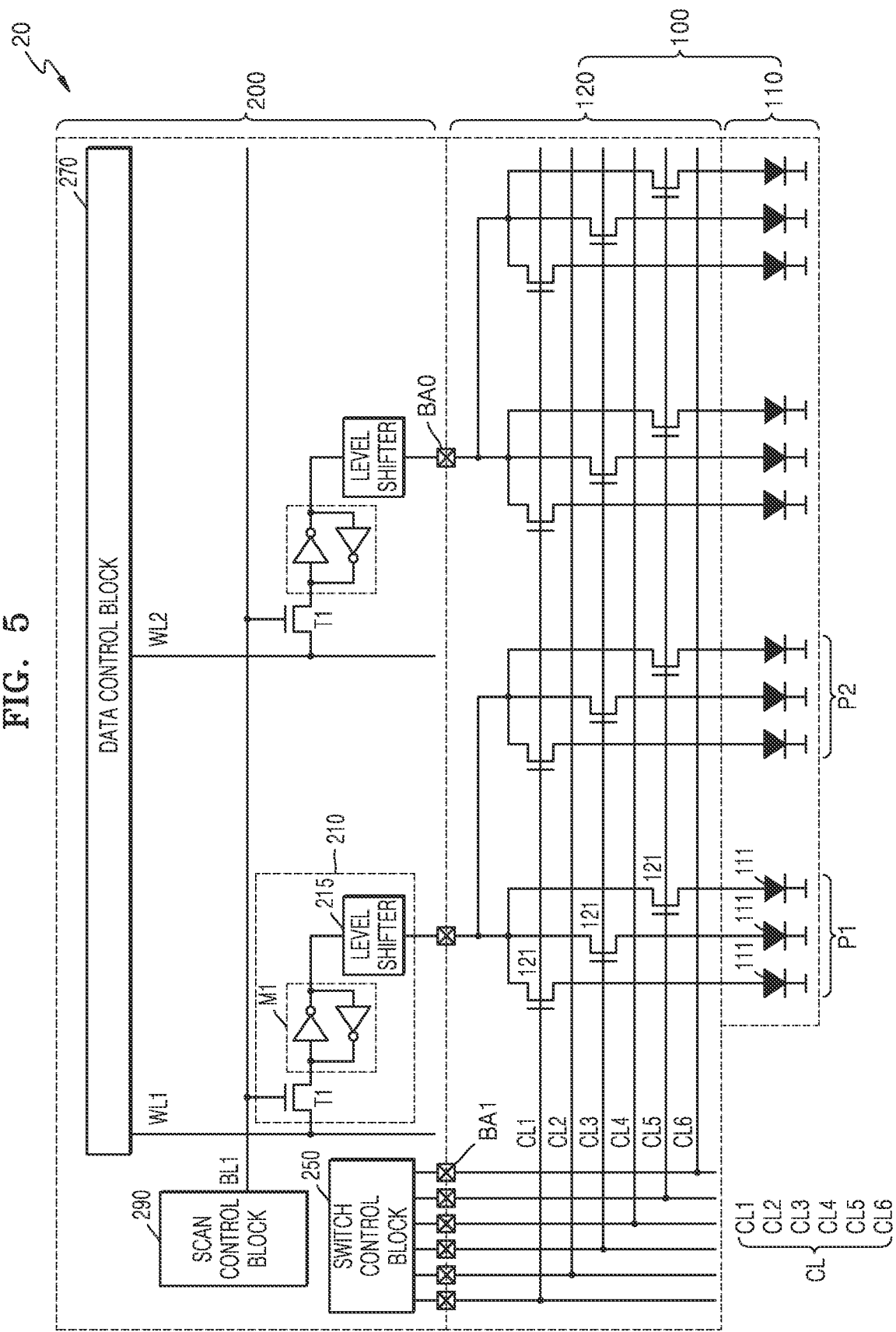
FIG. 5 is a conceptual diagram of a display device according to an embodiment.

FIG. 5 is a conceptual diagram of a display device 20 according to an example embodiment.

Referring to FIG. 5, one driving device 210 of the display device 20 according to an example embodiment may apply a driving signal to two or more pixels, and the one driving device 210 may implement two or more pixels. For example, six light-emitting devices 111, three of which are included in the first pixel P1 and three of which are included in a second pixel P2 of FIG. 5 may implement two pixels by receiving a driving signal from a first driving device. The plurality of light-emitting devices 111 constituting the first pixel P1 and the second pixel P2 may receive the driving signal by the one driving device 210, and a region of the driving layer 200 in which the one driving device 210 is arranged, the first pixel P1, and the second pixel P2 may be bonded to each other through one bonding area BA0. That is, one bonding area BA0 may be arranged for two pixels, and in this case, the bonding pitch may be about twice the bonding pitch in the case where one bonding area BA0 is arranged for one pixel. This configuration may be appropriate for the display device 20 requiring high PPI. The display device 20 according to an example embodiment may further include a level shifter 215 in the driving device 210. The switch control block 250 connected to the plurality of switching devices 121 of the first pixel P1 and the second pixel P2 may allocate the driving signal to each light-emitting device 111 included in the first pixel P1 and the second pixel P2. To this end, the switch control block 250 may include six connection lines CL1, CL2, CL3, CL4, CL5, and CL6, the number of which is equal to the number of light-emitting devices 111 included in the first pixel P1 and the second pixel P2, and the six connection lines CL1, CL2, CL3, CL4, CL5, and CL6 may extend and be connected to the switching devices 121 of the first pixel P1 and the second pixel P2 through six pairs of bonding areas BA1, respectively. However, the disclosure is not limited thereto, and the plurality of light-emitting devices 111 may implement three or more pixels. By implementing several pixels through one driving device 210, a wide bonding pitch may be secured, and thus, reduction in manufacturing yield during manufacturing a display may be alleviated or prevented. However, as at least two pixels are implemented through one driving device 210, the number of pairs of bonding areas BA0 per pixel may be reduced, but the number of pairs of bonding areas BA1 for connecting the switch control block 250 to the driving layer 200 may be increased. By appropriately considering this aspect in forming a display, the display device 20 may be efficiently configured.

Figure 6:
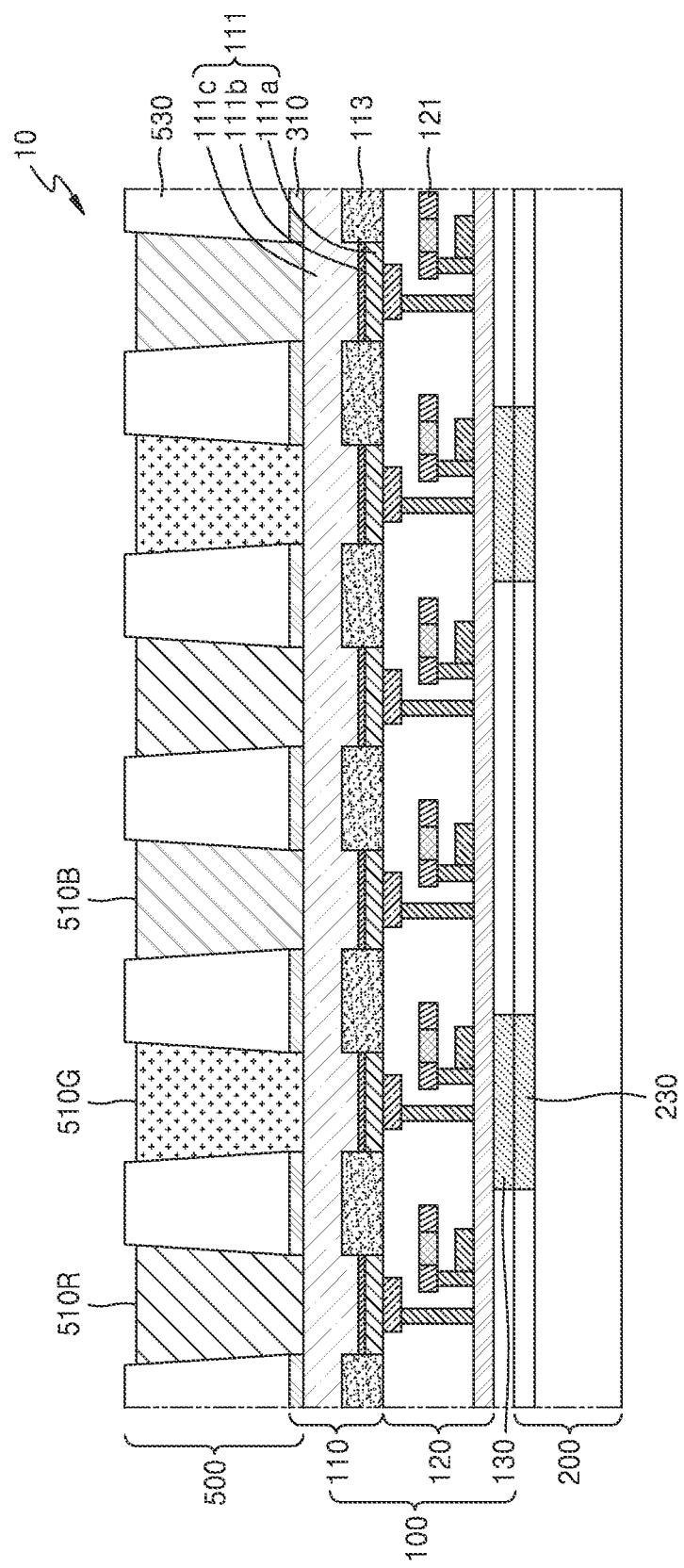
FIG. 6 is a diagram illustrating a display device including a color conversion layer, according to an example embodiment.

FIG. 6 is a diagram illustrating the display device 10 including a color conversion layer 500, according to an example embodiment.

The display layer 100 of the display devices 10 and 20 according to the example embodiments of FIGS. 1A to 5 may be passivated. In order for the display devices 10 and 20 to implement full color, a red-green-blue (RGB) display scheme of transferring and fixing, to each pixel, the light-emitting devices 111 each emitting red (R), green (G), or blue (B) light may be used, or a color conversion scheme of transferring and fixing, to all pixels, the light-emitting devices 111 emitting blue (B) light and then forming the color conversion layer 500 may be used. When the red-green-blue (RGB) display scheme is used, cross sections of the display devices 10 and 20 may appear similar to FIG. 1A, and the light-emitting devices 111 arranged on one pixel may respectively emit red (R), green (G), and blue (B) light. Referring to FIG. 6, the color conversion layer 500 may include a first color conversion layer 510R to convert color light emitted by a first light-emitting device into a first color, a second color conversion layer 510G to convert color light emitted by a second light-emitting device into a second color, and a third color conversion layer 510B to convert color light emitted by a third light-emitting device into a third color. For example, the first color may be red light, the second color may be green light, and the third color may be blue light. In the case where the light-emitting devices emit blue light, the first color conversion layer 510R may convert the blue light into red light, the second color conversion layer 510G may convert the blue light into green light, and the third color conversion layer 510B may include a resin that transmits the blue light without any color conversion. A partition wall 530 may be arranged between the color conversion layers 510R, 510G, and 510B.

The display devices 10 and 20 described with reference to FIGS. 1A to 5 may be used in various electronic devices. In particular, the display devices 10 and 20 according to the example embodiments may be useful for an AR and/or VR display having a glasses-type or head-mounted structure, which requires high PPI, or a device including the same. However, the disclosure is not limited thereto, and the display devices 10 and 20 may be used in a lens-type device or the like, and may be used in a general micro-LED display or the like.

Figure 7:
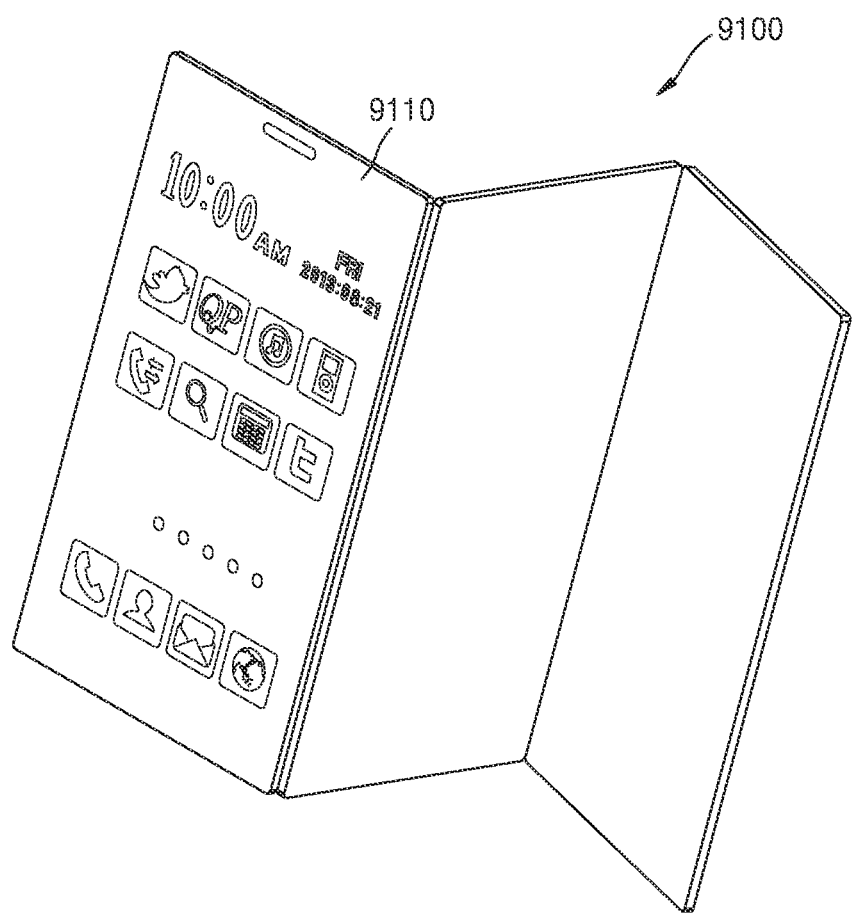
FIG. 7 is a diagram illustrating an example of applying a display device to a mobile device, according to an example embodiment.

FIG. 7 is a diagram illustrating an example in which the display devices 10 and 20 are applied to a mobile device 9100, according to an example embodiment. The mobile device 9100 may include a display device 9110 according to an example embodiment. The display device 9110 may include the display devices 10 and 20 described with reference to FIGS. 1A to 5. The display device 9110 may have a foldable structure and may be applied to, for example, a multi-folder display. Although the mobile device 9100 is illustrated as a folder-type display, the display device 9110 may be applicable to a general flat-panel display.

Figure 8:
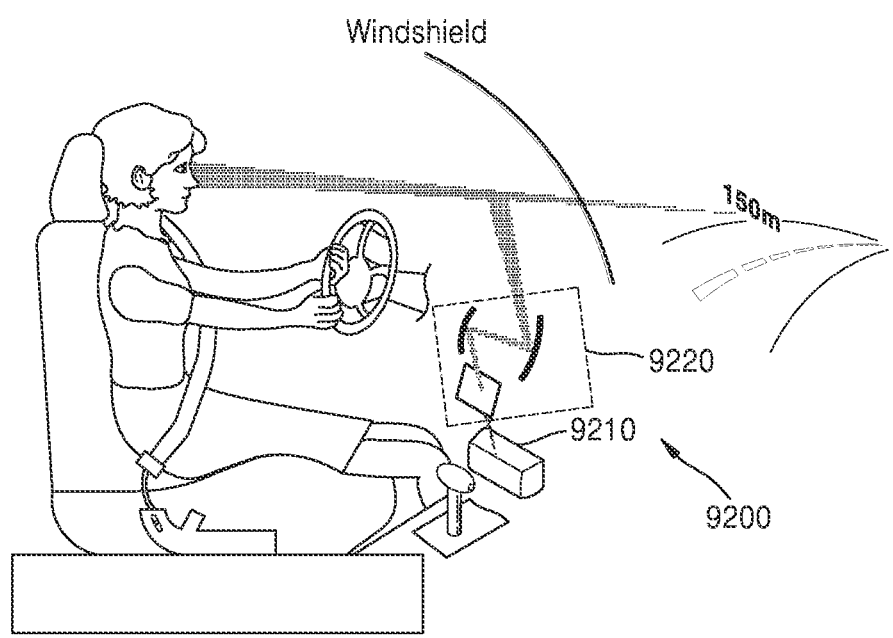
FIG. 8 is diagram illustrating an example of applying a display device to a vehicle, according to an example embodiment.

FIG. 8 is diagram illustrating an example in which the display devices 10 and 20 are applied to a vehicle, according to an example embodiment. The display devices 10 and 20 may be applied to a head-up display device for a vehicle. A head-up display device 9200 may include a display device 9210 provided in a region of the vehicle, and at least one light path changing member 9220 configured to convert the path of light to allow a driver to view an image generated by the display device 9210.

Figure 9:
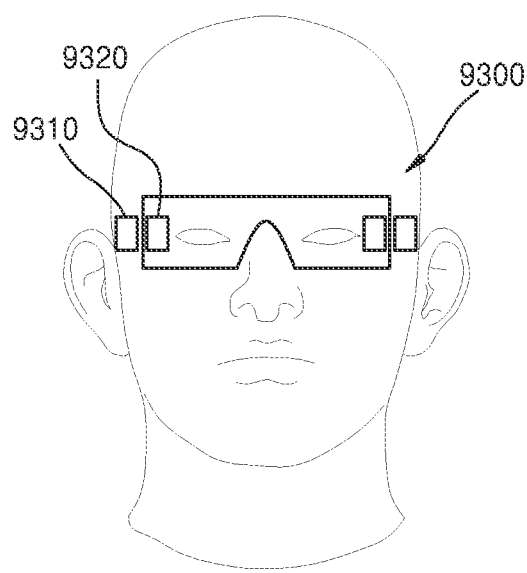
FIG. 9 is a diagram illustrating an example of applying a display device to augmented reality glasses or virtual reality glasses, according to an example embodiment.

FIG. 9 is a diagram illustrating an example in which the display devices 10 and 20 are applied to augmented reality glasses or virtual reality glasses, according to an example embodiment. Augmented reality glasses 9300 may include a projection system 9310 configured to form an image, and at least one element 9320 configured to guide the image from the projection system 9310 into the eyes of a user. The projection system 9310 may include the display devices 10 and 20 described with reference to FIGS. 1A to 5.

Figure 10:
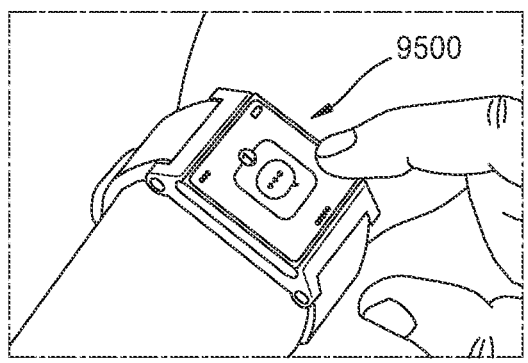
FIG. 10 is a diagram illustrating an example of applying a display device to a wearable display, according to an example embodiment.

FIG. 10 is a diagram illustrating an example in which the display devices 10 and 20 are applied to a wearable display 9500, according to an example embodiment. The wearable display 9500 may include the display devices 10 and 20 described with reference to FIGS. 1A to 5.

The display devices 10 and 20 according to example embodiments may be applied to an LED TV, a liquid crystal display, a mobile display, a smart watch, AR glass, VR glass, a head-up display, a signage, etc. In addition, the display devices 10 and 20 may be applied to various products such as a rollable TV or a stretchable display. In particular, they may be appropriate for devices requiring high PPI.

Example embodiments described herein are merely examples, and various modifications and other equivalent embodiments may be made from these embodiments by those of skill in the art. Therefore, the true technical protection scope according to the example embodiments should be determined by the technical spirit described in the following claims.

A display device according to an example embodiment may include a display layer having a monolithic structure, so as to increase a bonding pitch between bonding pads.

As the bonding pitch is secured in the display device according to an example embodiment, the manufacturing yield in manufacturing the display device may be improved.

The display device according to an example embodiment may be used in manufacturing a micro-LED display having high PPI.

A pair of bonding pads arranged in the display device according to an example embodiment may correspond to at least one pixel, and the pair of bonding pads may be connected to one driving device. That is, because a plurality of light-emitting devices or a plurality of sub-pixels may be connected to one driving device, the number of driving devices arranged on a substrate may be reduced, and thus the driving voltage, manufacturing costs and time of the display device may be reduced.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display device comprising:
a display layer comprising a plurality of light-emitting devices and a plurality of switching devices in a one-to-one correspondence with the plurality of light-emitting devices, wherein the plurality of light-emitting devices and the plurality of switching devices form a monolithic structure; and
a driving layer comprising a plurality of driving devices configured to apply at least one driving signal to the display layer,
wherein the display layer comprises a plurality of pixels each comprising at least one light-emitting device of the plurality of light-emitting devices and at least one switching device of the plurality of switching devices.

2. The display device of claim 1, wherein each of the plurality of driving devices corresponds to at least one of the plurality of pixels, and
wherein each of the plurality of driving devices is configured to apply a driving signal to the corresponding at least one of the plurality of pixels.

3. The display device of claim 1, wherein each of the plurality of driving devices corresponds to at least one of the plurality of pixels, and
wherein each of the plurality of driving devices is electrically connected to the corresponding at least one of the plurality of pixels by a respective pair of bonding pads from among a plurality of pairs of bonding pads between the driving layer and the display layer.

4. The display device of claim 3, wherein a gap between adjacent pairs of bonding pads of the plurality of pairs of bonding pads is greater than or substantially equal to a gap between adjacent pixels of the plurality of pixels.

5. The display device of claim 3, wherein a gap between adjacent pairs of bonding pads of the plurality of pairs of bonding pads is greater than a gap between adjacent light-emitting device of the plurality of light-emitting devices.

6. The display device of claim 1, wherein the plurality of pixels comprises a first pixel and a second pixel, and
wherein a first driving device among the plurality of driving devices is configured to apply a first driving signal to each of the first pixel and the second pixel.

7. The display device of claim 1, wherein the plurality of pixels comprises a first pixel comprising a plurality of first light-emitting devices among the plurality of light-emitting devices and a plurality of first switching devices among the plurality of switching devices, the plurality of first switching devices respectively corresponding to the plurality of first light-emitting devices,
wherein a first driving device among the plurality of driving devices is configured to apply a first driving signal among the at least one driving signal to the first pixel, and
wherein each of the plurality of first light-emitting devices in the first pixel is configured to receive a different portion of the first driving signal via the corresponding first switching device.

8. The display device of claim 7, wherein the different portions of the first driving signal are obtained by a time-series division of the first driving signal, and
wherein the time-series division is performed by sequential switching operations via the plurality of switching devices.

9. The display device of claim 1, wherein the display layer comprises:
a light-emitting layer comprising the plurality of light-emitting devices; and
a switching layer between the light-emitting layer and the driving layer and comprising the plurality of switching devices, and
wherein the light-emitting layer and the switching layer do not have a bonding layer therebetween.

10. The display device of claim 1, wherein the driving layer further comprises a plurality of switch control blocks configured to control the plurality of switching devices to allocate different portions of the at least one driving signal to the plurality of light-emitting devices.

11. The display device of claim 10, wherein the driving layer further comprises a data control block comprising a plurality of column lines and a scan control block comprising a plurality of row lines,
wherein a driving device among the plurality of driving devices corresponds to a pixel among the plurality of pixels and is connected to a column line among the plurality of column lines and a row line among the plurality of row lines,
wherein the row line corresponds to a switch control block among the plurality of switch control blocks and to a row of pixels from among the plurality of pixels,
wherein some of the plurality of light-emitting devices are connected to the row line, and
wherein the plurality of switching devices corresponding to the some of the plurality of light-emitting devices are controlled by the switch control block.

12. The display device of claim 11, wherein the switch control block comprises a plurality of connection lines,
- wherein a number of bonding pads connecting the switch control block to the display layer is equal to a number of the plurality of light-emitting devices included in the pixel, and
- wherein the plurality of connection lines extend along the row of pixels connected to the row line and the plurality of connection lines are connected to switching devices from among the plurality of switching devices corresponding to the some of the plurality of light-emitting devices included in the row of pixels connected to the row line.

13. The display device of claim 12, wherein the row of pixels connected to the row line comprises a first pixel and a second pixel, and
- wherein a connection line of the plurality of connection lines is connected to both of a first switching device corresponding to a first light-emitting device included in the first pixel and a second switching device corresponding to a second light-emitting device included in the second pixel.

14. The display device of claim 1, wherein at least one of the plurality of light-emitting devices has a size of about 0.1 μm to about 200 μm.

15. A display layer comprising:
- a light-emitting layer comprising a plurality of light-emitting devices;
- a switching layer comprising a plurality of switching devices, the plurality of switching devices corresponding to the plurality of light-emitting devices in a one-to-one manner;
- a plurality of pixels, each comprising at least one light-emitting device of the plurality of light-emitting devices and at least one switching device of the plurality of switching devices; and
- a plurality of bonding pads,
- wherein each of the plurality of bonding pads corresponds to a pixel of the plurality of pixels,
- wherein the plurality of bonding pads are arranged on a surface of the display layer,
- wherein the light-emitting layer is on a first side of the switching layer and the plurality of bonding pads are on a second side of the switching layer, the second side being opposite to the first side, and
- wherein the plurality of light-emitting devices and the plurality of switching devices form a monolithic structure.

16. The display layer of claim 15,
- wherein the light-emitting layer and the switching layer have no bonding layer therebetween.

17. The display layer of claim 15, wherein a gap between adjacent bonding pads of the plurality of bonding pads is greater than or substantially equal to a gap between adjacent pixels of the plurality of pixels.

18. The display layer of claim 15, wherein a gap between adjacent bonding pads of the plurality of bonding pads is greater than or substantially equal to a gap between adjacent light-emitting devices of the plurality of light-emitting devices.

19. The display layer of claim 15, wherein at least one of the plurality of light-emitting devices has a size of about 0.1 μm to about 200 μm.

* * * * *